(12) United States Patent
Caraghiorghiopol et al.

(10) Patent No.: US 8,350,532 B2
(45) Date of Patent: Jan. 8, 2013

(54) POWER MANAGEMENT SYSTEMS

(75) Inventors: Eftimie Caraghiorghiopol, San Jose, CA (US); Laszlo Lipcsei, Campbell, CA (US); Alexandru Hartular, San Jose, CA (US); Marian Niculae, San Jose, CA (US)

(73) Assignee: O2Micro Inc., Santa Clara, CA (US)

( * ) Notice: Subject to any disclaimer, the term of this patent is extended or adjusted under 35 U.S.C. 154(b) by 24 days.

(21) Appl. No.: 13/042,267

(22) Filed: Mar. 7, 2011

(65) Prior Publication Data

US 2011/0156483 A1    Jun. 30, 2011

Related U.S. Application Data

(63) Continuation-in-part of application No. 12/336,783, filed on Dec. 17, 2008.

(60) Provisional application No. 61/008,427, filed on Dec. 20, 2007.

(51) Int. Cl.
*H02J 7/04* (2006.01)

(52) U.S. Cl. ........................................ 320/145; 320/140

(58) Field of Classification Search .................. None
See application file for complete search history.

(56) References Cited

U.S. PATENT DOCUMENTS

| | | | |
|---|---|---|---|
| 5,898,234 A * | 4/1999 | Kitagawa | 320/128 |
| 6,236,122 B1 | 5/2001 | Maeda et al. | |
| 6,465,984 B2 | 10/2002 | Fukuoka et al. | |
| 6,989,981 B2 | 1/2006 | Popescu-Stanesti et al. | |
| 7,202,634 B2 | 4/2007 | Bucur | |
| 7,203,048 B2 | 4/2007 | Shyr et al. | |
| 7,598,707 B2 | 10/2009 | Yamamoto | |
| 2005/0116697 A1 * | 6/2005 | Matsuo et al. | 323/282 |
| 2006/0202737 A1 | 9/2006 | Walter | |
| 2006/0255768 A1 * | 11/2006 | Yoshio | 320/134 |
| 2009/0102432 A1 * | 4/2009 | Hsieh et al. | 320/163 |

FOREIGN PATENT DOCUMENTS

| | | |
|---|---|---|
| CN | 1167355 A | 12/1997 |
| CN | 101071951 A | 11/2007 |

OTHER PUBLICATIONS

Storti, S.; Consiglieri, F.; Paparo, M., "A 30-A 30-V DMOS motor controller and driver," Solid-State Circuits, IEEE Journal of, vol. 23, No. 6, pp. 1394-1401, Dec. 1988.

Tanzawa, T.; Tanaka, T., "A dynamic analysis of the Dickson charge pump circuit," Solid-State Circuits, IEEE Journal of, vol. 32, No. 8, pp. 1231-1240, Aug. 1997.

(Continued)

*Primary Examiner* — Edward Tso
*Assistant Examiner* — Robert Grant

(57) ABSTRACT

A power management system includes a first switch, a second switch, and a controller coupled to the first and second switches. The first switch has a first transfer terminal. The second switch has a second transfer terminal. The controller controls power conversion by turning on a third switch periodically. The first and second transfer terminals and a third transfer terminal of the third switch are coupled to a common node. The resistance between the first transfer terminal and the common node, the resistance between the second transfer terminal and the common node, and the resistance between the third transfer terminal and the common node are substantially equal to zero.

22 Claims, 11 Drawing Sheets

OTHER PUBLICATIONS

Sawada, K.; Sugawara, Y.; Masui, S., "An on-chip high-voltage generator circuit for EEPROMs with a power supply voltage below 2V," VLSI Circuits, 1995. Digest of Technical Papers., 1995 Symposium on, pp. 75-76, Jun. 8-10, 1995.

Cho, T.B.; Gray, P. R., "A 10-bit, 20-MS/s, 35-mW pipeline A/D converter," Custom Integrated Circuits Conference, 1994., Proceedings of the IEEE 1994, pp. 499-502, May 1-4, 1994.

Jieh-Tsorng Wu; Kuen-Long Chang, "MOS charge pumps for low-voltage operation," Solid-State Circuits, IEEE Journal of, vol. 33, No. 4, pp. 592-597, Apr. 1998.

Favrat, P.; Deval, P.; Declercq, M. J., "A high-efficiency CMOS voltage doubler," Solid-State Circuits, IEEE Journal of, vol. 33, No. 3, pp. 410-416, Mar. 1998.

* cited by examiner

POWER MANAGEMENT SYSTEMS

RELATED APPLICATIONS

The present application is a continuation-in-part of U.S. patent application Ser. No. 12/336,783, filed Dec. 17, 2008, titled "Power Management Systems with Charge Pumps", which claims priority to U.S. Provisional Application Ser. No. 61/008,427, filed on Dec. 20, 2007, both of which are incorporated herein by reference in its entirety.

BACKGROUND

Integrated circuits are widely used in many applications such as power management systems, power conversion systems, etc. There is a need for integrated circuits that have a compact package, small printed circuit board, low cost, and low power consumption.

SUMMARY

In one embodiment, a power management system includes a first switch, a second switch, and a controller coupled to the first and second switches. The first switch has a first transfer terminal. The second switch has a second transfer terminal. The controller controls power conversion by turning on a third switch periodically. The first and second transfer terminals and a third transfer terminal of the third switch are coupled to a common node. The resistance between the first transfer terminal and the common node, the resistance between the second transfer terminal and the common node, and the resistance between the third transfer terminal and the common node are substantially equal to zero.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Figure 1:
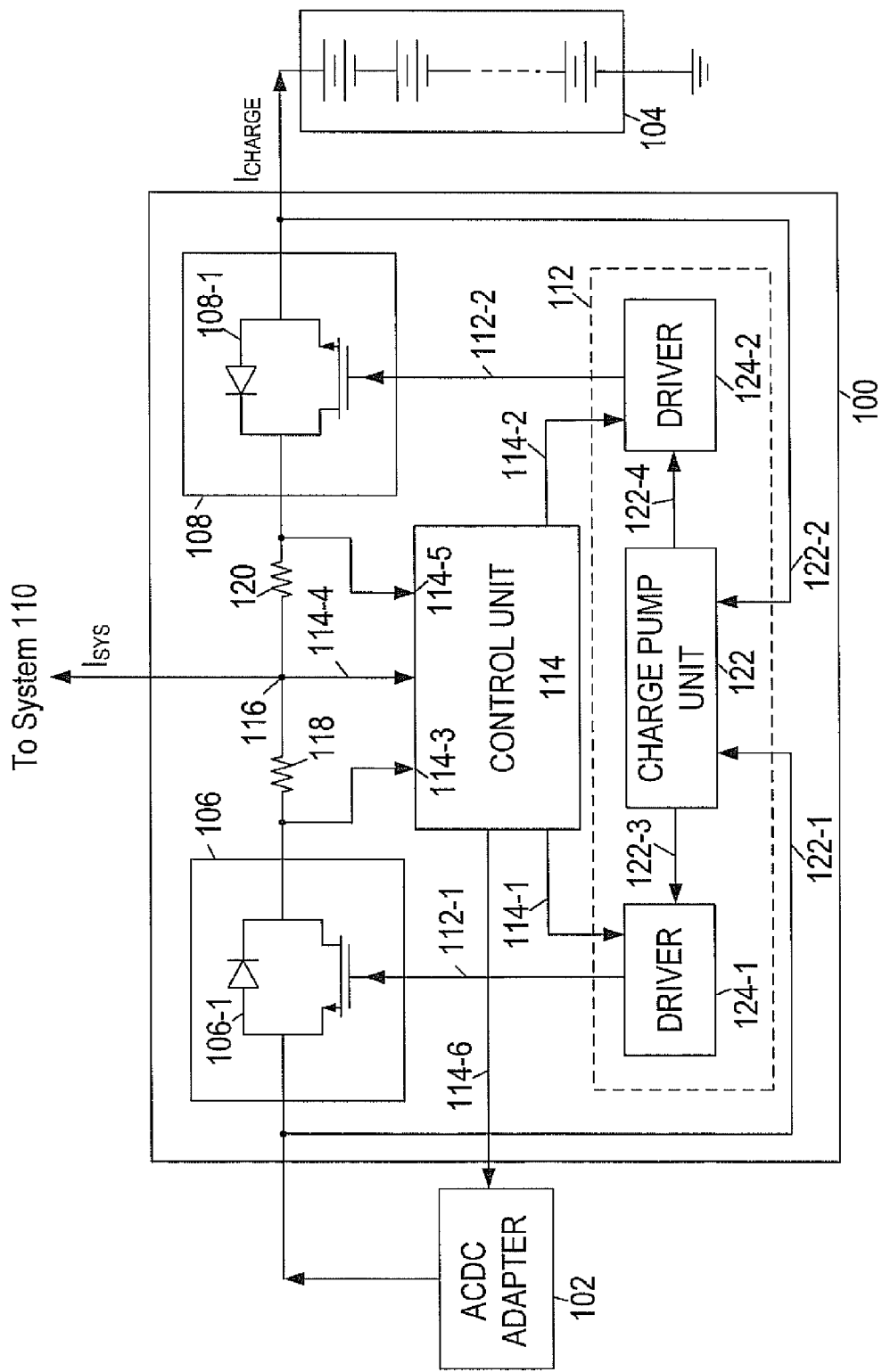
FIG. 1 illustrates a block diagram of an example of a power management system in accordance with one embodiment of the present invention.

FIG. 1 illustrates a block diagram of an example of a power management system 100 using NMOS switches and a corresponding driving circuit, in accordance with one embodiment of the present invention. The power management system 100 is operable for controlling power supply from a power source, e.g., an AC/DC adapter 102 and/or a battery pack 104, to a system 110 via two NMOS switches 106 and 108, in one embodiment. As shown in FIG. 1, the power source for the system 110 can be an output controllable AC/DC adapter 102 and the battery pack 104, which can be a rechargeable battery pack. However, the power source for the system 110 can be any of a variety of power sources, such as an AC/DC adapter with a fixed output, a DC "cigarette" type adapter, a battery pack, etc. The battery pack 104 can include any type of rechargeable battery pack, such as lithium-ion, nickel-cadmium, or nickel-metal hydride batteries, or the like. The system 110 can be any of a variety of electronic devices which include, but are not limited to, a server computer, a desktop computer, a laptop computer, a cell phone, a personal digital assistant, etc.

In one embodiment, the power management system 100 is also operable for controlling power from the AC/DC adapter 102 to charge the battery pack 104 via NMOS switches 106 and 108. The power management system 100 further includes a control unit 114 which is operable for monitoring the power supply status of the system 110 and the status of the battery pack 104, in one embodiment. Depending on the status of the system 110 and the battery pack 104, the control unit 114 selects a working mode for the power management system 100. Those modes include, but are not limited to: default mode, operation mode, charging operation mode, discharging mode, and heavy load mode. In default mode, both NMOS switches 106 and 108 are in off states, and the system 110 and the power management system 100 are powered by either the AC/DC adapter 102 or by the battery pack 104 (whichever has the higher output voltage) through one of the body diodes 106-1 or 108-1 that are intrinsically built into the respective switches, 106 and 108. In the operation mode, the NMOS switch 106 can be switched on and the NMOS switch 108 can be switched off, and thus the system 110 can be powered by the AC/DC adapter 102 via the switch 106. In the charging mode, both the NMOS switches 106 and 108 are in on states, and thus the AC/DC adapter 102 can power the system 110 as well as charge the battery pack 104. In the discharging mode, the NMOS switch 106 is in off state and the NMOS switch 108 is in on state, and thus the system 110 can draw power from the battery pack 104. In the heavy load mode, both the switches 106 and 108 are in on state, and thus the AC/DC adapter 102 and the battery pack 104 can supply power simultaneously to the system 110 which has a heavy load (e.g., a power requirement of the system 110 is greater than the output power rating of the AC/DC adapter 102).

In each working mode, the control unit 114 can generate control signals (e.g., switch control signals 114-1 and 114-2) to control the conductance status of the NMOS switches 106 and 108, and to control an output (e.g., output current, output voltage, and/or output power) of the AC/DC adapter 102. As previously stated herein, an NMOS switch may need a driving signal having a voltage level greater than a voltage level at its source terminal. Thus, in one embodiment, a driving circuit 112 is provided to generate adequate driving signals to drive the NMOS switches 106 and 108, such that the NMOS switches 106 and 108 can be fully switched on and off.

In other embodiments, the power management system 100 can also control power supply from multiple power sources and/or multiple battery packs to the system 110 by using multiple NMOS switches and corresponding driving circuits. Furthermore, by using multiple NMOS switches, the power management system 100 can also charge multiple battery packs either simultaneously or individually.

As illustrated in FIG. 1, the NMOS switches 106 and 108 are respectively coupled to a common node 116 via two sensing resistors 118 and 120. Power supply from the AC/DC adapter 102 and/or the battery pack 104 is delivered to the system 110 via the common node 116, in one embodiment. The conductance status of the NMOS switches 106 and 108 are controlled by two switch control signals 114-1 and 114-2 which are generated by the control unit 114, in one embodiment. In one embodiment, the driving circuit 112 is used to convert the switch control signals 114-1 and 114-2 to appropriate driving signals 112-1 and 112-2, respectively.

The driving circuit 112 includes two drivers 124-1 and 124-2, which are respectively coupled between the control unit 114 and the NMOS switches 106 and 108, in one embodiment. In addition to the drivers 124-1 and 124-2, a charge pump unit 122 is also included in the driving circuit 112. The charge pump unit 122 has two input terminals 122-1 and 122-2 and two output terminals 122-3 and 122-4, in one embodiment. The input terminals 122-1 and 122-2 are respectively coupled to the output terminals of the ACDC adapter 102 and the battery pack 104. The output terminals 122-3 and 122-4 are respectively coupled to the drivers 124-1 and 124-2. The charge pump unit 122 is operable for generating a voltage greater than a source voltage from the input terminals 122-1 and 122-2 of the charge pump unit 122. In one embodiment, the source voltages of the charge pump unit 122 can be the output voltage of the AC/DC adapter 102 ($V_{ad}$) and the output voltage of the battery pack 104 ($V_{batt}$). Thus, the charge pump unit 122 can provide an output signal having a voltage level greater than that of $V_{ad}$ at the output terminal 122-3 to driver 124-1. Another output signal having a voltage level greater than that of $V_{batt}$ can also be output at the output terminal 122-4 and provided to driver 124-2. Thus, the drivers 124-1 and 124-2 respectively receive the output signals of the charge pump unit 122, and generate driving signals 112-1 and 112-2 having adequate output voltage levels to fully switch on/off the NMOS switches 106 and 108. Once the driver 124-1 or 124-2 receives a switch control signal from the control unit 114, the driver 124-1 or 124-2 can provide the driving signal 112-1 (or 112-2) having an adequate voltage level to drive the NMOS switch 106 or 108.

Figure 2:
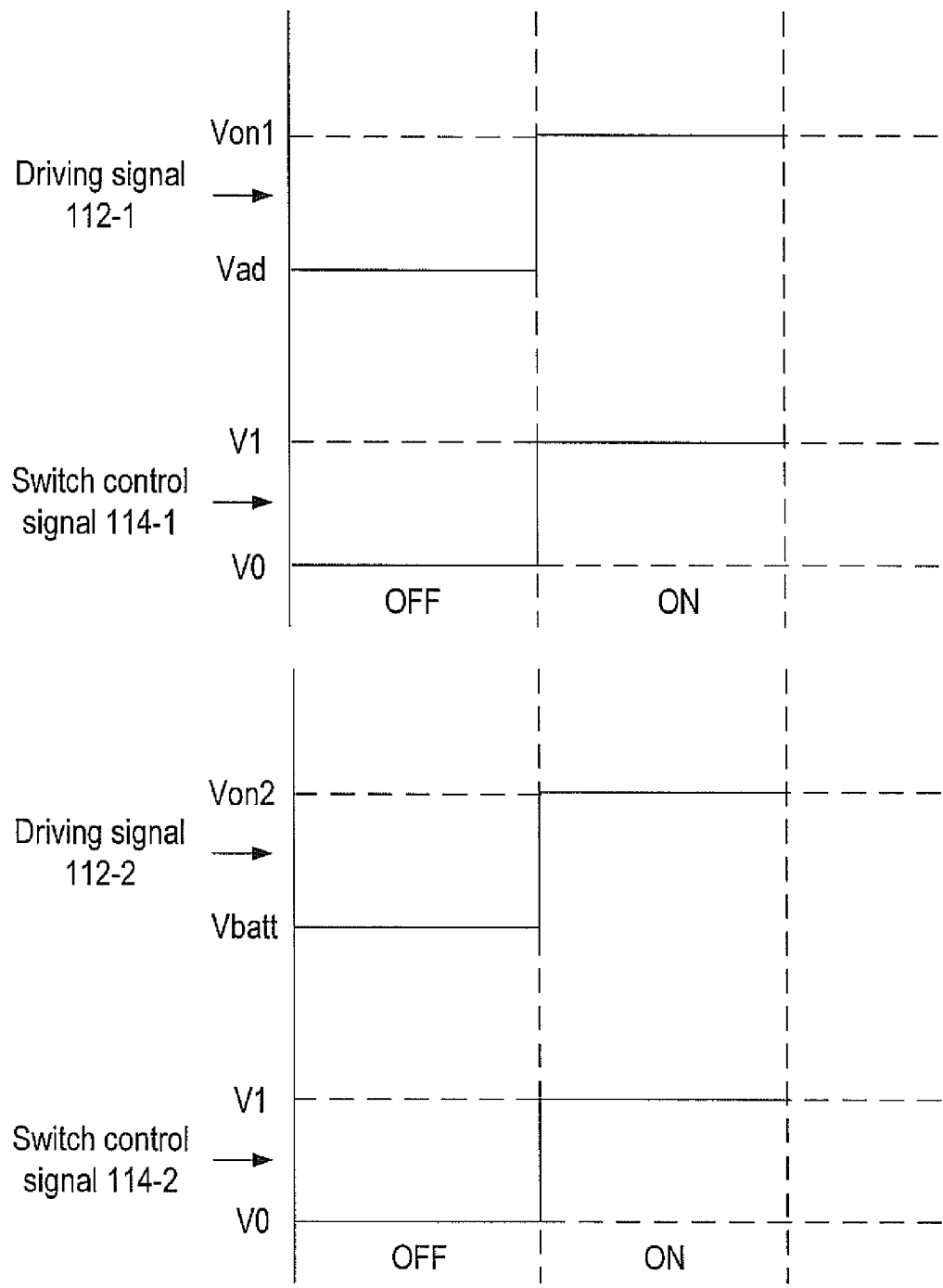
FIG. 2 illustrates examples of waveforms of switch control signals and driving signals in accordance with one embodiment of the present invention.

FIG. 2 shows examples of waveforms of switch control signals (114-1 and 114-2) and driving signals (112-1 and 112-2) in the power management system 100, in accordance with one embodiment of the present invention. As shown in the example of FIG. 2, the switch control signal 114-1 (or 114-2) has two voltage levels V0 (e.g., 0 volt) and V1 (e.g., 1.8 volts or 3.3 volts). In one embodiment, the control unit 114 generates a switch control signal 114-1 (or 114-2) having the voltage level V0 to instruct the driving circuit 112 to switch NMOS switch 106 (or 108) off. The control unit 114 can also generate a switch control signal 114-1 (or 114-2) having the voltage level V1 to instruct the driving circuit 112 to switch the NMOS switch 106 (or 108) on. By using the driving circuit 112, the switch control signal 114-1 (or 114-2) can be converted to a driving signal 112-1 (or 112-2). As shown in FIG. 2, the driving signal 112-1 has two voltage levels $V_{ad}$ (e.g., 12V) and $V_{on1}$ (e.g., 18V). The driving signal 112-2 has two voltage levels $V_{batt}$ (e.g., 4.2 volts) and $V_{on2}$ (e.g., 10 volts). The NMOS switch 106 (or 108) is fully switched off if the driving signal 112-1 (or 112-2) has the voltage level $V_{ad}$ (or $V_{batt}$), in one embodiment. If the driving signal 112-1 (or 112-2) has the voltage level $V_{on1}$ (or $V_{on2}$), the NMOS switch 106 (or 108) is fully switched on, in one embodiment. Therefore, a combination of the charge pump unit 122 and the drivers 124-1 and 124-2 can provide adequate driving signals 112-1 and 112-2 to drive the NMOS switches 106 and 108.

Returning to FIG. 1, the charge pump unit 122 can be implemented by two individual charge pumps, in one embodiment. For example, the input terminal 122-1 can be an input of a first charge pump which generates a signal having a voltage level greater than $V_{ad}$ at the output terminal. The input terminal 122-2 can be an input of a second charge pump which generates a signal having a voltage level greater than $V_{batt}$ at the output terminal 122-4. The charge pump unit 122 can also be a single charge pump which is operable for providing an output signal to the driver 124-1 or 124-2, in one embodiment. However, in another embodiment, multiple individual charge pumps can be used in the charge pump unit 122 to provide voltage signals to multiple drivers when multiple NMOS switches are employed in the power management system 100. In yet another embodiment, a single charge pump can be used in the charge pump unit 122 to alternately provide voltage signals to multiple drivers in a time-sharing way. In the time-sharing way, the multiple drivers can share the voltage signals provided by the single charge pump of the charge pump unit 122 by allocating one driver's idle time to service other drivers.

Before the power management system 100 is powered on, the power management system 100 is in the default mode, in which both NMOS switches 106 and 108 are in off states, in one embodiment. Once the power management system 100 is powered on, power can be delivered from the AC/DC adapter 102 and/or from the battery pack 104 to the system 110. Although NMOS switches 106 and 108 are in off states, power can be delivered via body diodes 106-1 and 108-1 which are intrinsically built into the NMOS switches 106 and 108. As shown in FIG. 1, the body diode 106-1 has its anode intrinsically coupled to the source terminal of the NMOS switch 106 and its cathode coupled to the drain terminal of the NMOS switch 106. The body diode 108-1 also has its anode and cathode respectively coupled to the source terminal and drain terminal of the NMOS switch 108.

If the AC/DC adapter 102 is not available, the system 110 as well as the power management system 100 can be powered on by the battery pack 104, in one embodiment. Under such circumstances, the body diode 108-1 is forward biased and the current generated by the battery pack 104 can flow through the body diode 108-1 to power the system 110, in one embodiment.

In one embodiment, the ACDC adapter 102 and the battery pack 104 may present simultaneously. Therefore, the system 110 and the power management system 100 can be either powered by the ACDC adapter 102 or by the battery pack 104, in one embodiment. If $V_{ad}$ is greater than $W_{att}$, the body diode 106-1 is forward biased and the body diode 108-1 is reverse biased. Consequently, a current generated by the ACDC adapter 102 can flow through the body diode 106-1. Thus, the system 110 and the power management system 100 can draw power from the ACDC adapter 102. Otherwise, in the default mode, if $V_{ad}$ is less than $V_{batt}$, the body diode 106-1 is reverse biased and the body diode 108-1 is forward biased, and the system 110 and the power management system 100 are powered by the battery pack 104. If $V_{ad}$ is equal to $V_{batt}$, the system 110 and the power management system 100 can randomly draw power from the ACDC adapter 102 and/or the battery pack 104.

Once the system 110 and the power management system 100 are powered on, the control unit 114 starts to manage power supply of the system 110 and the charging process of the battery pack 104. If the power management system 100 and the system 110 are powered on, under the control of the control unit 114, the NMOS switches 106 and 108 can be fully switched on. Since an ON-state resistance of an NMOS switch can be relatively small, a voltage drop on a conducting NMOS switch may not exceed the conducting threshold of its body diode. Consequently, the body diode may not be conducting a significant current. Thus, after the system 110 is powered on, the current generated by the ACDC adapter 102 and/or the battery pack 104 may not flow through the body diode 106-1 and/or 108-1.

The control unit 114 can monitor the status of the ACDC adapter 102 and the battery pack 104, in one embodiment. As illustrated in FIG. 1, the control unit 114 has three sensing terminals 114-3, 114-4 and 114-5. In one embodiment, the sensing terminal 114-3 is coupled to the drain terminal of the NMOS switch 106. The sensing terminal 114-4 is coupled to the common node 116. The sensing terminal 114-5 is coupled to the drain terminal of the NMOS switch 108. Via the sensing terminals 114-3, 114-4 and 114-5, information such as $V_{ad}$, $V_{sys}$ (input voltage of system 110), and $V_{batt}$ can be monitored. Furthermore, voltage drops on the sensing resistors 118 and 120, and a current which flows through the sensing resistors 118 and 120, can be obtained according to the monitored information from sensing terminals 114-3, 114-4 and 114-5. For example, the current which flows through the NMOS switch 106 can be measured by dividing the voltage drop on the sensing resistor 118 ($V_{ad}$-$V_{SYS}$) by the resistance of the sensing resistor 118.

According to the status of the ACDC adapter 102 and the battery pack 104, the control unit 114 enters a specified working mode and generates multiple control signals, in one embodiment.

If the control unit 114 detects that the battery pack 104 is in an under-voltage condition, the control unit 114 can enter the charging operation mode, in which the AC/DC adapter 102 powers the system 110 and charges the battery pack 104. In the charging operation mode, switch control signals 114-1 and 114-2 having the voltage level V1 are generated by the control unit 114. Upon receiving the switch control signals 114-1 and 114-2, driving signals 112-1 and 112-2 having voltage levels Von1 and Von2 are generated, which in turn switch on the NMOS switches 106 and 108. Moreover, an AC/DC adapter control signal 114-6 can also be generated by the control unit 114. The AC/DC adapter control signal 114-6 can adjust the output (e.g., output current, output voltage, and/or output power) of the AC/DC adapter 102 to satisfy the power requirement of the system 110 and the charging power requirement of the battery pack 104, in one embodiment. In the charging operation mode, the output current of the AC/DC adapter 102 flows through the NMOS switch 106 to the common node 116. Then, a charging current $I_{CHARGE}$ flows through the NMOS switch 108 to the battery pack 104 and a system current $I_{SYS}$ flows to the system 110.

The charging operation mode continues until the control unit 114 detects that the battery pack 104 is fully charged, in one embodiment. Then the control unit 114 enters the operation mode, in which the adapter 102 powers the system 110, in one embodiment. In the operation mode, the control unit 114 switches off the NMOS switch 108 and switches on the NMOS switch 106, such that a current equal to $I_{SYS}$ flows through the NMOS switch 106 to the system 110. The NMOS switch 108 is switched off, which in turn avoids an overcharge condition of the battery pack 104.

If the AC/DC adapter 102 is not available, then to maintain proper operation of the system 110 and the power management system 100, the power management device 100 enters a discharging mode, in one embodiment. In the discharging mode, the control unit 114 switches NMOS switch 106 off and NMOS switch 108 on. Thus, the system 110 can be powered by the battery pack 104.

In addition, if the power requirement of the system 110 exceeds the designed power rating of the AC/DC adapter 102, the power management system 110 enters the heavy load mode. In the heavy load mode, the control unit 114 can generate switch control signals 114-1 and 114-2 to switch on the NMOS switches 106 and 108. Thus, the system 110 can be powered by the AC/DC adapter 102 and the battery pack 104 simultaneously. In addition to the switch control signal 114-1 and 114-2, the control unit 114 can also adjust the output of the AC/DC adapter 102 so as to provide enough power to maintain a proper operation of the system 110.

Advantageously, since an NMOS switch can have an ON-state resistance substantially smaller than a PMOS switch having the same size, the power dissipation caused by the NMOS switches 106 and 108 can be reduced, in one embodiment. Power dissipation on each NMOS switch in each operation mode of the power management system 100 can be determined. For example, assume that an ON-state resistance of each NMOS switch is 10 milliohm (mΩ) the power management system 100 works in the charging operation mode (e.g., $I_{SYS}$=4 A, $I_{CHARGE}$=3 A, and the output voltage of the AC/DC adapter 102 is 12V). Then, power dissipation on the NMOS switch 106 is approximately 0.49 W (10 mΩ×(4 A+3 A)$^2$=0.49 W). Power dissipation on the NMOS switch 108 is approximately 0.09 W (10 mΩ×(3 A)$^2$=0.09 W). Therefore, the total power dissipation on the NMOS switches 106 and 108 is approximately 0.58 W. Consequently, in the power management system 100, the power dissipation on the NMOS switches 106 and 108 only leads to a 0.7% decrease in the power transfer efficiency of the power management system 100, in one embodiment. Advantageously, NMOS switches can significantly increase the power transfer efficiency of the power management system 100 if multiple NMOS switches are used. Furthermore, the overall performance and stability can be enhanced since less power dissipates on NMOS switches.

Figure 3:
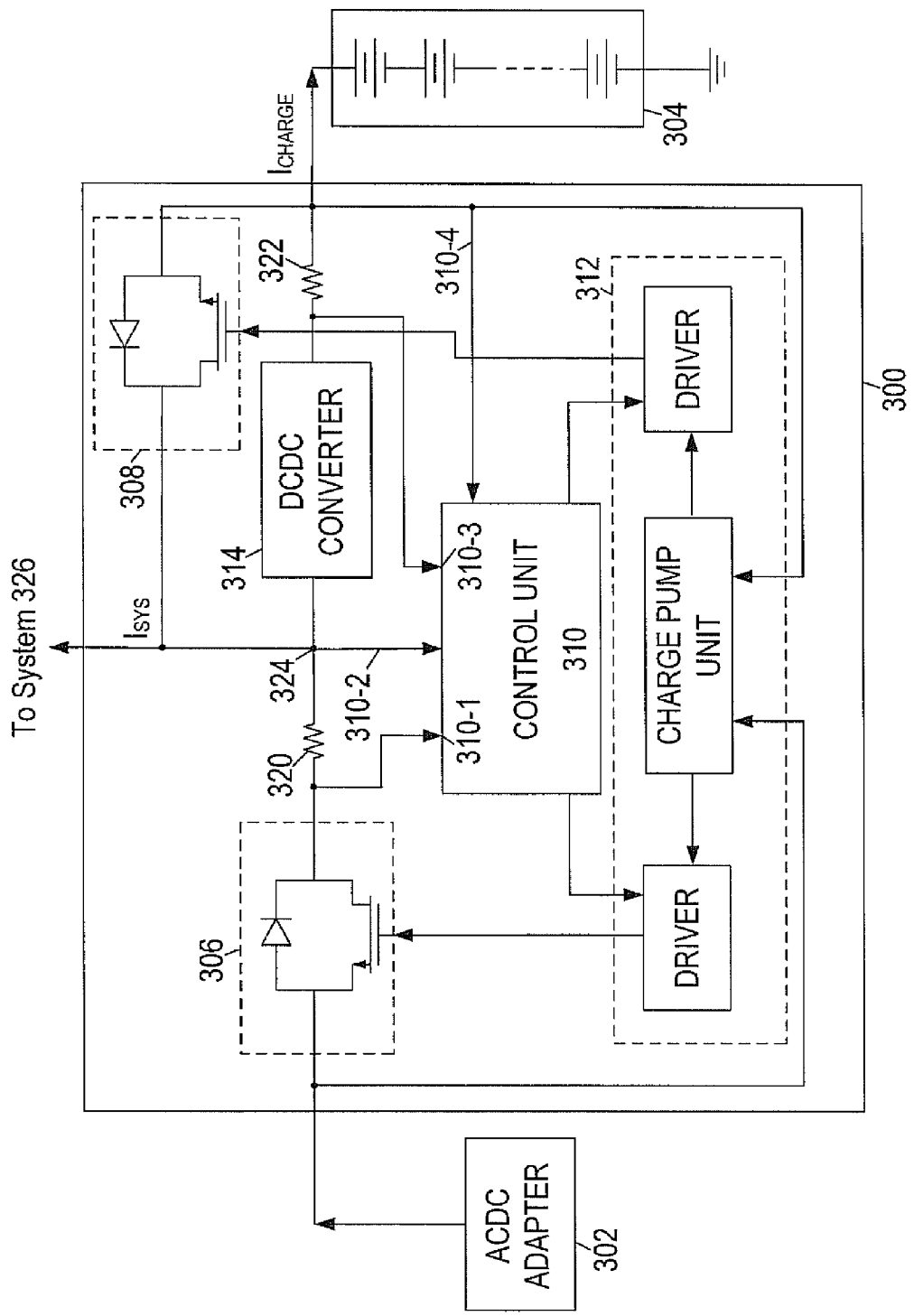
FIG. 3 illustrates a block diagram of an example of a power management system in accordance with another embodiment of the present invention.

FIG. 3 illustrates a block diagram of an example of a power management system 300 in which NMOS switches, a driving circuit and a DC/DC converter are employed, according to another embodiment. The power management system 300 is operable for providing power to a system 326 as well as charging a battery pack 304 which can include various types of battery cells. As shown in FIG. 3, the power management system 300 includes two NMOS switches 306 and 308, a control unit 310, a driving circuit 312, and a DC/DC converter 314, in one embodiment. The NMOS switches 306 and 308 are operable for controlling power supply from a power source 302, e.g., an AC/DC adapter and/or from a rechargeable battery pack 304, to a system 326, in one embodiment. The power management system 300 has similar functionalities as the power management system 100.

In one embodiment, the source terminal of the NMOS switch 306 is coupled to an output terminal of the power source 302. The drain terminal of the NMOS switch 306 is coupled to a common node 324 via a sensing resistor 320. A source terminal and a drain terminal of the NMOS switch 308 are respectively coupled to an output terminal of the rechargeable battery pack 304 and the common node 324. As shown in FIG. 3, the DC/DC converter 314 is coupled between the common node 324 and a sensing resistor 322 having one end coupled to the output of the rechargeable battery pack 304, in one embodiment.

In one embodiment, the control unit 310 has four sensing terminals 310-1, 310-2, 310-3 and 310-4. As illustrated in FIG. 3, the sensing terminals 310-1-310-4 are respectively coupled to the drain terminal of the NMOS switch 306, the common node 324, the output terminal of the DC/DC converter 314, and the output terminal of the rechargeable battery pack 304. By detecting the status of the power source 302 and the rechargeable battery pack 304, the control unit 310 can control the conductance status of the NMOS switches 306 and 308, in one embodiment.

In one embodiment, if the control unit 310 detects that the rechargeable battery pack 304 is in an under-voltage condition, the control unit 310 can switch on the NMOS switch 306 and switch off the NMOS switch 308. The DC/DC converter 314 receives the output voltage of the power source 302 and converts it to a voltage appropriate for charging the battery pack 304. The converted voltage can be further used to charge the rechargeable battery pack 304. The DC/DC converter 314 can include, but is not limited to, a buck converter, a boost converter, or a buck-boost converter. For example, if the output voltage level of the power source 302 is lower than a charging voltage required by the rechargeable battery pack 304, a boost converter can be used. A buck converter can also be used if the output voltage level of the power source 302 is greater than a maximum charging voltage of the battery pack 304. Advantageously, the power management system 300 increases power transfer efficiency, and can also be used with various power sources and rechargeable battery packs.

Figure 4:
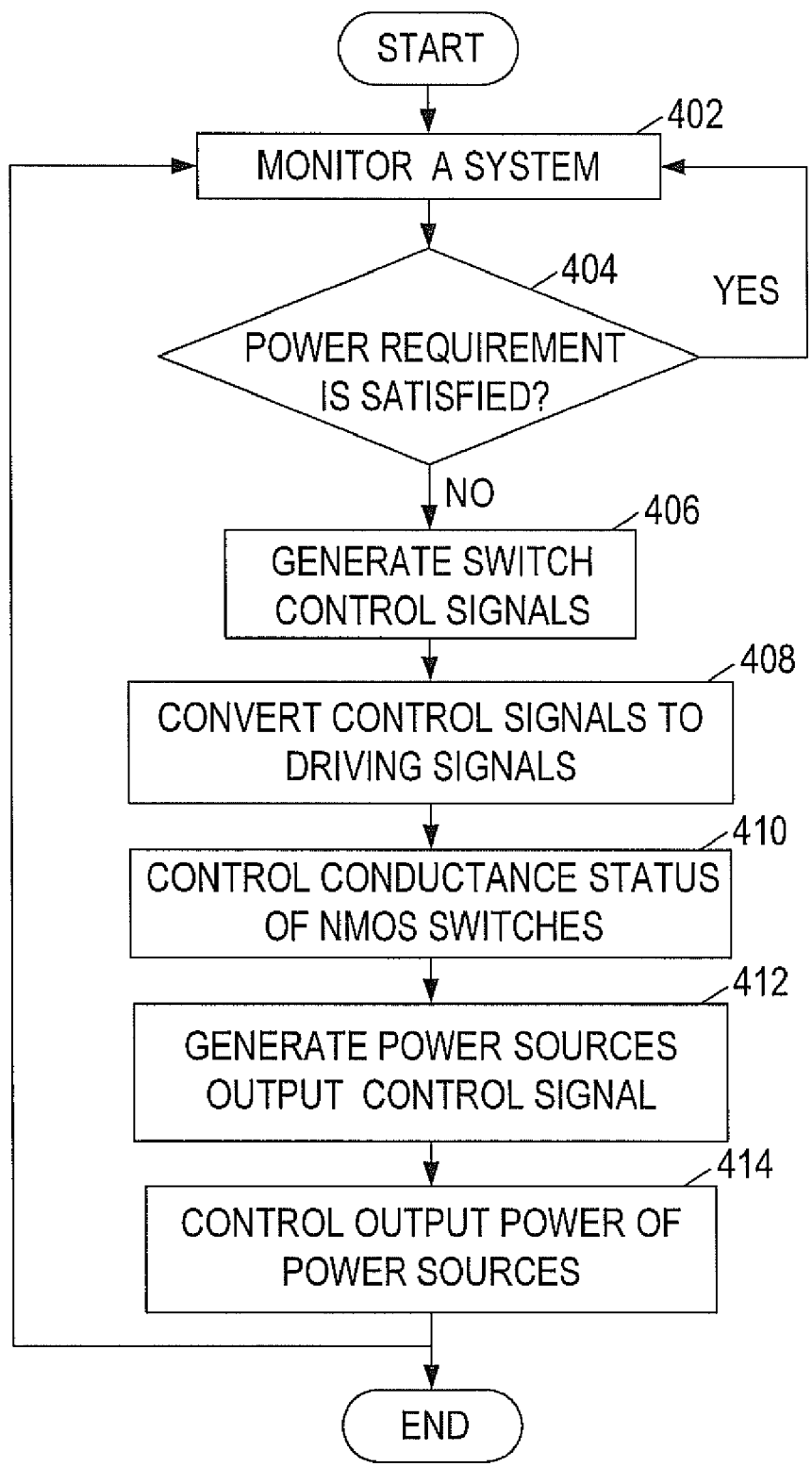
FIG. 4 illustrates a flowchart of a method of controlling power supply in accordance with another embodiment of the present invention.

FIG. 4 illustrates a flowchart of a method for controlling power supply to a system according to one embodiment of the present invention. To control power supply to the system, the status of the system can be monitored, in block 400. In one embodiment, an input current (or voltage) of the system and an output voltage of a battery pack in the system can be monitored, in block 402. According to the monitored status of the system, a power requirement of the system can be determined. In block 404, if the power requirement of the system is satisfied, the status of the system can be further monitored. If the power requirement of the system is not satisfied, multiple control signals can be generated and/or adjusted, in block 406. In one embodiment, the aforementioned multiple control signals can be multiple NMOS switch control signals which can be used to control the conductance status of multiple NMOS switches. Each of the aforementioned multiple NMOS switches can be coupled between a power source and the system, in one embodiment. By using multiple NMOS switch control signals, one or more NMOS switches can be turned on to provide enough power to the system. The aforementioned multiple control signals can be further converted to driving signals which have adequate driving ability to fully switch on/off the NMOS switches, in block 408. In one embodiment, to fully switch on/off an the NMOS switch, an NMOS switch control signal can be converted to a driving voltage which has a voltage level greater than a source voltage of the NMOS switch. By using multiple driving signals, multiple NMOS switches of the system can be fully switched on/off so as to provide sufficient power to the system, in block 410. In one embodiment, multiple control signals can be converted to multiple driving signals by using a driving circuit which includes a charge pump unit. In addition to controlling the conductance status of multiple NMOS switches, multiple power source output control signals can be generated to control output (e.g., output power, output current or output voltage) of multiple power sources, in block 412. In one embodiment, a power source output control signal can adjust the output voltage of a power source. By using multiple output controls signals, output powers delivered to the system can be adjusted according to the power requirement of the system, in block 414.

In one embodiment, a power management system includes power select switches for selecting power, and a controller to turn on a high-side switch and a low-side switch alternately to control power conversion of the power management system. In one such embodiment, the power select switches, the controller, the high-side switch, and the low-side switch are integrated in a package. The power select switches and the high-side switch share a common node, and therefore they can share one pin of the package. Advantageously, by the sharing of the common node, the switches and the controller can be integrated in the package more compactly. In addition, the size of the printed circuit board, the cost, and the power consumption for the power management system can be reduced.

Figure 5:
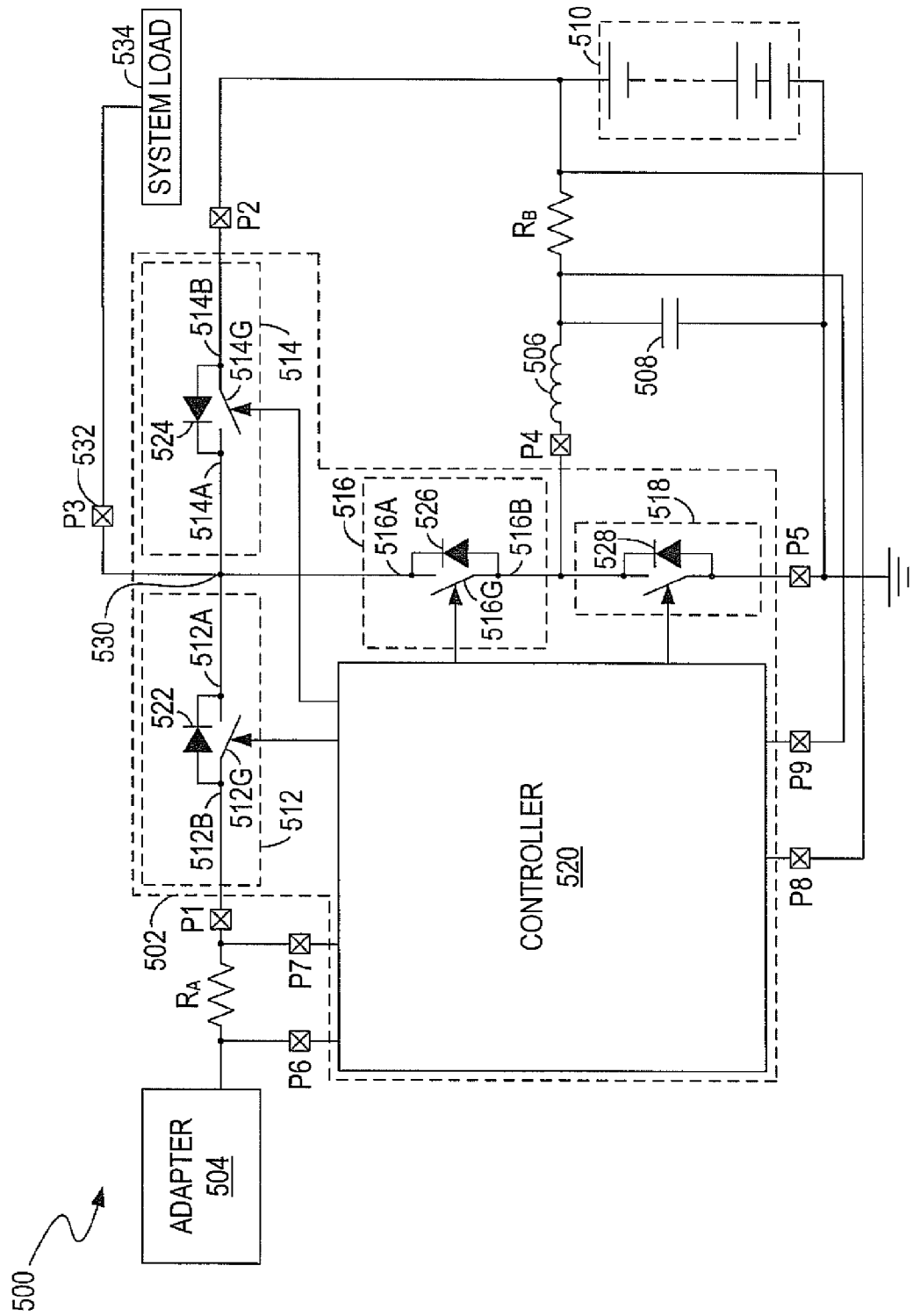
FIG. 5 illustrates a circuit diagram of an example of a power management system, in accordance with one embodiment of the present invention.

FIG. 5 illustrates a circuit diagram of an example of a power management system 500, in accordance with one embodiment of the present invention. The power management system 500 includes an adapter 504, power control circuitry 502, a battery pack 510, and a system load 534. The battery pack 510 can include any type of rechargeable batteries such as lithium-ion batteries, nickel-cadmium, lead-acid batteries, solar batteries, or the like. The power control circuitry 502 controls power flow between the adapter 504, the battery pack 510, and the system load 534.

As shown in FIG. 5, the power control circuitry 502 includes a first switch 512 (e.g., a power select switch), a second switch 514 (e.g., a power select switch), a third switch 516 (e.g., a high-side switch), and a fourth switch 518 (e.g., a low-side switch). The first switch 512 includes a first transfer terminal 512A (e.g., a drain or a source), a transfer terminal 512B (e.g., a source or a drain), a control terminal 512G (e.g., a gate), and a body diode 522. The second switch 514 includes a second transfer terminal 514A (e.g., a drain or a source), a transfer terminal 514B (e.g., a source or a drain), a control terminal 514G (e.g., a gate), and a body diode 524. The third switch 516 includes a third transfer terminal 516A (e.g., a drain or a source), a transfer terminal 516B (e.g., a source or a drain), a control terminal 516G (e.g., a gate), and a body diode 526. The first transfer terminal 512A, the second transfer terminal 514A, and the third transfer terminal 516A are coupled to a common node 530. The cathodes of the body diodes 522, 524 and 526 are also coupled to the common node 530. In addition, the fourth switch 518 includes a body diode 528 having a cathode coupled to the transfer terminal 516B of the third switch 516. The first switch 512 and the second switch 514 can be used to select power from difference power sources, e.g., the adapter 504 and the battery pack 510. The third switch 516 and the fourth switch 518 can be used to convert power. The power control circuitry 502 further includes a controller 520 coupled to the control terminals of the switches 512, 514, 516 and 518 to control the switches 512, 514, 516 and 518.

The controller 520 can control the switches 512, 514, 516 and 518, such that the first switch 512 transfers power from the adapter 504 to the system load 534 via the common node 530. For example, the controller 520 turns on the first switch 512 and turns off the switches 514, 516 and 518. Accordingly, a supply current from the adapter 504 can flow to the system load 534 through the first switch 512 and the common node 530. The controller 520 can also control the switches 512, 514, 516 and 518, such that the second switch 514 transfers power from the battery pack 510 to the system load 534 via the common node 530. For example, the controller 520 turns on the second switch 514 and turns off the switches 512, 516 and 518. Accordingly, a supply current from the battery pack 510 can flow to the system load 534 through the second switch 514 and the common node 530. The controller 520 can also turn on the switches 512 and 514, and turns off the switches 516 and 518. Accordingly, the adapter 504 and the battery pack 510 can power the system load 534 via the common node 530 in parallel.

The controller 520 can also control the switches 512, 514, 516 and 518, such that the first switch 512 and the second switch 514 transfer power from the adapter 504 to charge the battery pack 510 via the common node 530. For example, the controller 520 turns on the second switch 514 and turns off the switches 512, 516 and 518. A charging current from the adapter 504 can flow to the battery pack 510 through the body diode 522 of the first switch 512, the common node 530, and the drain-source channel of the second switch 514. For another example, the controller 520 turns on the switches 512 and 514 and turns off the switches 516 and 518. A charging current from the adapter 504 can flow to the battery pack 510 through both the body diode 522 and the drain-source channel of the first switch 512, through the common node 530, and through the drain-source channel of the second switch 514.

In addition, the controller 520, the switches 516 and 518, the inductor 506, and the capacitor 508 can operate as direct-current to direct-current (DC/DC) conversion circuitry, e.g., buck conversion circuitry, boost conversion circuitry, or buck-boost conversion circuitry. The controller 520 can control the power conversion performed by the DC/DC conversion circuitry by turning on the third switch 516 periodically with a duty cycle. The controller 520 can also adjust output power of the power management system 500, e.g., output power at a common pin 532 (labeled P3) or output power at the pin P4, by adjusting the duty cycle of the third switch 516.

More specifically, in one embodiment, the controller 520 controls the switches 512, 514, 516 and 518, such that the conversion circuitry, e.g., operating as buck conversion circuitry, receives input power, e.g., an input voltage and/or an input current, from the adapter 504 via the common node 530, and converts the input power to output power, e.g., an output voltage and/or an output current, to charge the battery pack 510. The controller 520 can turn on the first switch 512, turn off the second switch 514, and generate a pulse-width modulation (PWM) signal to turn on the switches 516 and 518 alternately. The controller 520 can increase the output power to the battery pack 510 by increasing the duty cycle of the PWM signal, e.g., the duty cycle of the third switch 516, or decrease the output power by decreasing the duty cycle. In another embodiment, the controller 520 controls the switches 512, 514, 516 and 518, such that the conversion circuitry, e.g., operating as boost conversion circuitry, receives input power, e.g., an input voltage and/or an input current, from the battery pack 510, converts the input power to output power, e.g., an output voltage and/or an output current, and transfers the output power to the system load 534 via the common node 530. The controller 520 turns off the switches 512 and 514, and generates a pulse-width modulation (PWM) signal to turn on the switches 516 and 518 alternately. The controller 520 can decrease the output power to the system load 534 by increasing the duty cycle of the PWM signal, e.g., the duty cycle of the third switch 516, or increase the output power by decreasing the duty cycle.

In one embodiment, the switches 512, 514, 516 and 518 and the controller 520 are integrated in a package. The first transfer terminal 512A of the first switch 512, the second transfer terminal 514A of the second switch 514, and the third transfer terminal 516A of the third switch 516 are coupled to a common node 530 directly. More specifically, resistance $R_{TC1}$ between the first transfer terminal 512A and the common node 530, resistance $R_{TC2}$ between the second transfer terminal 514A and the common node 530, and resistance $R_{TC3}$ between the third transfer terminal 516A and the common node 530 are substantially equal to zero. "Substantially equal to zero", as used herein, means that the resistance between the common node 530 and the transfer terminal 512A, 514A, or 516A is relatively small and can be neglected. By way of example, the switches 512, 514 and 516, e.g., metal-oxide-semiconductor field-effect transistors (MOSFETs), can be fabricated on the same semiconductor substrate, e.g., n-type substrate. The semiconductor substrate includes the transfer terminals 512A, 514A and 516A, e.g., the drains, of the switches 512, 514 and 516, and also includes the common node 530. In this example, the resistances $R_{TC1}$, $R_{TC2}$ and $R_{TC3}$ are considered to be zero or substantially equal to zero. For another example, the transfer terminal 512A, 514A, or 516A is coupled to the common node 530 via a bonding wire, e.g., a metal wire, a gold wire, an aluminum wire, etc. In this example, the resistances $R_{TC1}$, $R_{TC2}$, or $R_{TC3}$ is also considered to be zero or substantially equal to zero.

Advantageously, the first switch 512, e.g., for selecting power, the second switch 514, for selecting power, and the third switch 516, e.g., for converting power, share the common node 530. As such, the circuits, e.g., the controller 520 and the switches 512, 514, 516 and 518, in the power control circuitry 502 can be integrated in a package more compactly. In addition, the first switch 512, the second switch 514, and the third switch 516 share a common pin 532. Thus, the size of the printed circuit board for the power control circuitry 502 can be reduced. The cost and the power consumption for the power control circuitry 502 can also be reduced.

Figure 6A:
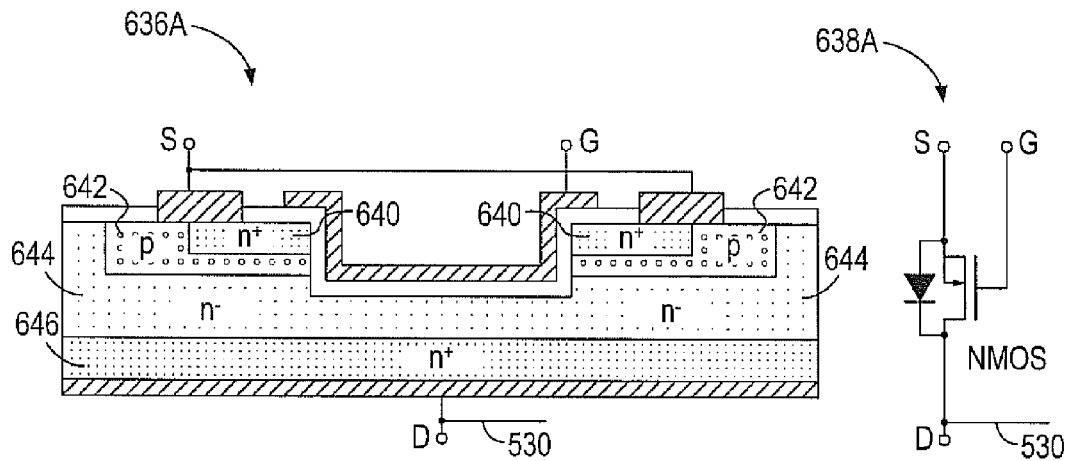
FIGS. 6A and 6B illustrate connection diagrams of examples of a switch and a common node, in accordance with embodiments of the present invention.

FIG. 6A illustrates connection diagrams 636A and 638A of examples of a switch (e.g., the switch 512, 514, or 516) and the common node 530, in accordance with one embodiment of the present invention. FIG. 6A is described in combination with FIG. 5. Diagram 636A shows a cross-section of the switch. Diagram 638A shows a circuit model for the switch. Although the switch in diagram 636A is a vertical-channel U-shape MOSFET, the invention is not so limited. The switch can be any type of vertical-channel MOSFET, e.g., U-shape MOSFET, V-shape MOSFET, double-diffused MOSFET, etc. The switch may also be a surface-channel MOSFET.

In one embodiment, the switch is an n-channel MOSFET (NMOSFET). More specifically, as shown in diagrams 636A and 638A, the terminal labeled "D" represents the drain, the terminal labeled "S" represents the source, and the terminal labeled "G" represents the gate. The switch includes an n-type semiconductor well 640 (hereinafter, n-well 640), a p-type semiconductor well 642 (hereinafter, p-well 642), an n-type semiconductor layer 644 (hereinafter, n-layer 644), and an n-type semiconductor substrate 646 (hereinafter, n-substrate 646). When a gate-source voltage that is higher than the threshold voltage of the switch applies to the terminals G and S, the n-well 640 is connected to the n-layer 644. Accordingly, the n-well 640, the n-layer 644, and the n-substrate 646 form an n-type semiconductor channel (n-channel).

In addition, the p-well 642 and the n-layer 644 form a body diode, and the cathode of the body diode is connected to the n-substrate 646. Thus, in one such embodiment, the n-substrate 646 is connected to the common node 530.

Figure 6B:
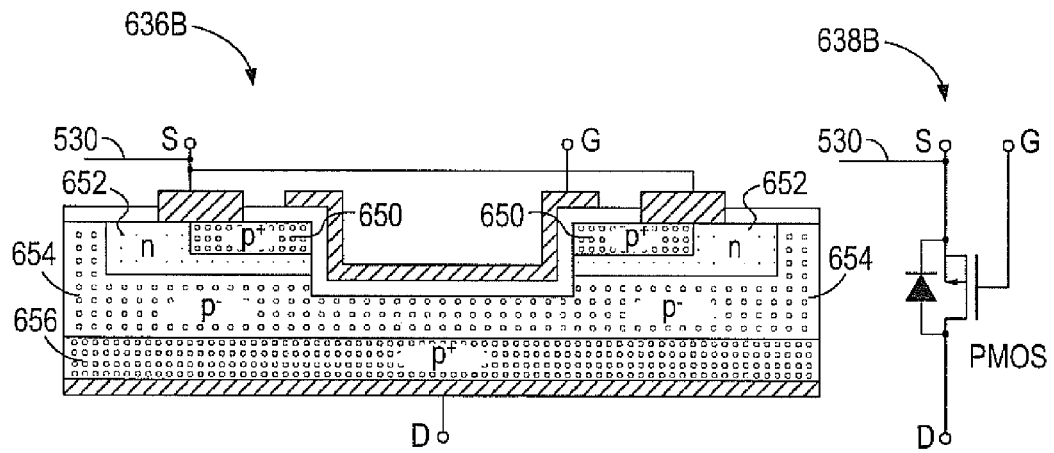

FIG. 6B illustrates connection diagrams 636B and 638B of examples of a switch (e.g., the switch 512, 514, or 516) and the common node 530, in accordance with another embodiment of the present invention. FIG. 6B is described in combination with FIG. 5. Diagram 636B shows a cross-section of the switch. Diagram 638B shows a circuit model for the switch. Although the switch in diagram 636B is a vertical-channel U-shape MOSFET, the invention is not so limited. The switch can be any type of vertical-channel MOSFET, e.g., U-shape MOSFET, V-shape MOSFET, double-diffused MOSFET, etc. The switch may also be a surface-channel MOSFET.

In one embodiment, the switch is a p-channel MOSFET (PMOSFET). More specifically, as shown in diagrams 636B and 638B, the terminal labeled "D" represents the drain, the terminal labeled "S" represents the source, and the terminal labeled "G" represents the gate. The switch includes a p-well 650, an n-well 652, a p-layer 654, and a p-substrate 656. When a gate-source voltage that is lower than the threshold voltage of the switch applies to the terminals G and S, the p-well 650 is connected to the p-layer 654. Accordingly, the p-well 650, the p-layer 654, and the p-substrate 656 form a p-type semiconductor channel (p-channel).

In addition, the n-well 652 and the p-layer 654 form a body diode, and the cathode of the body diode is connected to the p-well 650. Thus, in one such embodiment, the p-well 650 is connected to the common node 530.

Figure 7:
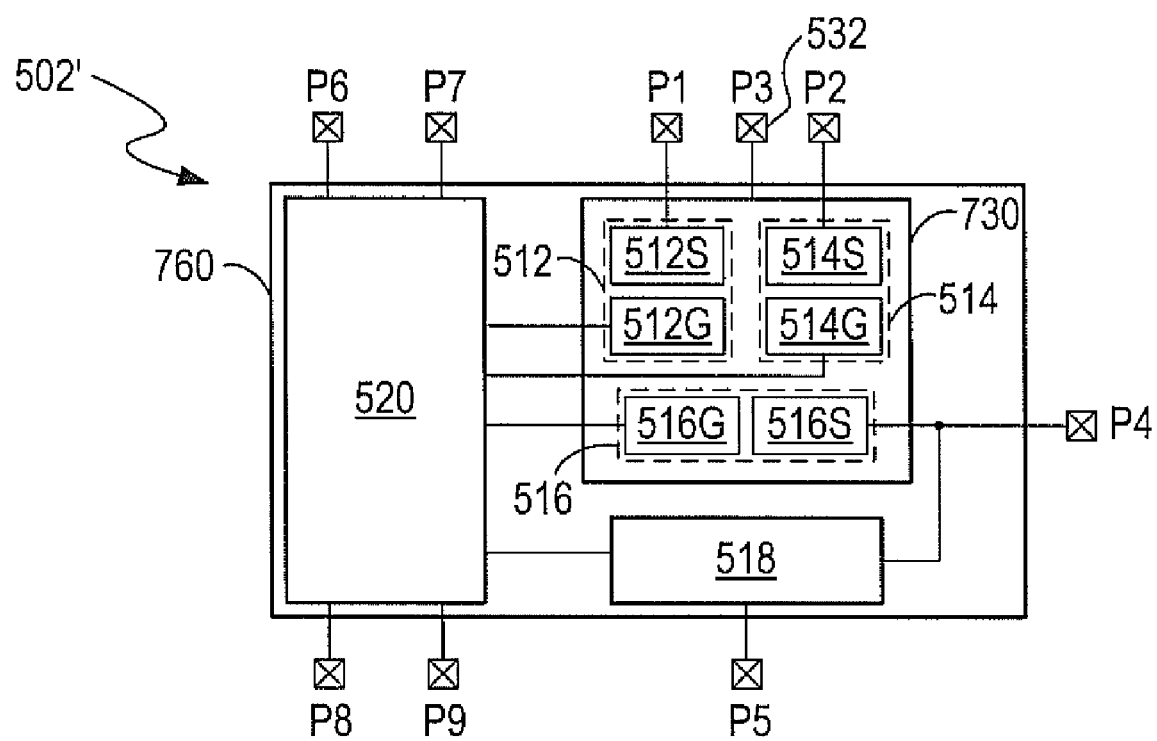
FIG. 7 illustrates a connection diagram of an example of power control circuitry, in accordance with one embodiment of the present invention.

FIG. 7 illustrates a connection diagram of an example of a power control circuitry 502', in accordance with one embodiment of the present invention. FIG. 7 is described in combination with FIG. 5 and FIG. 6A. In one embodiment, the structure of the power control circuitry 502' applies to the power control circuitry 502. In one embodiment, the controller 520 and the switches 512, 514, 516 and 518 are integrated to a package, e.g., attached or soldered to a non-conductive substrate 760.

In the example of FIG. 7, the first switch 512, the second switch 514, and the third switch 516 are NMOSFETs and can have the structure similar to that shown in FIG. 6A. Thus, the first switch 512, the second switch 514, and the third switch 516 can be fabricated on a common semiconductor substrate 730, e.g., an n-type semiconductor substrate. In this example, the semiconductor substrate 730 includes the first transfer terminal 512A, e.g., the drain, of the first switch 512, the second transfer terminal 514A, e.g., the drain, of the second switch 514, and the third transfer terminal 516A, e.g., the drain, of the third switch 516. The semiconductor substrate 730 also includes the common node 530.

More specifically, as shown in FIG. 7, the source of the first switch 512 is labeled 512S, and the gate of the first switch 512 is labeled 512G. The source of the second switch 514 is labeled 514S, and the gate of the second switch 514 is labeled 514G. The source of the third switch 516 is labeled 516S, and the gate of the third switch 516 is labeled 516G. The drains of the switches 512, 514 and 516 are included in the semiconductor substrate 730. The source 512S of the first switch 512 is connected to the pin P1, e.g., that transfers power for the adapter 504. The source 514S of the second switch 514 is connected to the pin P2, e.g., that transfers power for the battery pack 510. The source 516S of the third switch 516 is connected to the pin P4, e.g., that transfers power for the power control circuitry 502. The controller 520 is connected to the gates 512G, 514G and 516G to control the switches 512, 514 and 516. Moreover, the semiconductor substrate 730 is connected to the common pin 532, e.g., that transfers power for the adapter 504, the battery pack 510, the power control circuitry 502, and the system load 534, via a bonding wire (e.g., a metal wire, a gold wire, an aluminum wire, or the like).

Advantageously, the first switch 512, the second switch 514, and the third switch 516 share a semiconductor substrate. The power control circuitry 502' can be integrated more compactly. The size of the printed circuit board, as well as the cost and the power consumption, is further reduced.

FIGS. 8A to 8D illustrate connection diagrams of examples of power control circuitry 502A, 502B, 502C and 502D, in accordance with other embodiments of the present invention. FIGS. 8A to 8D are described in combination with FIG. 5, FIG. 6A and FIG. 6B.

Figure 8A:
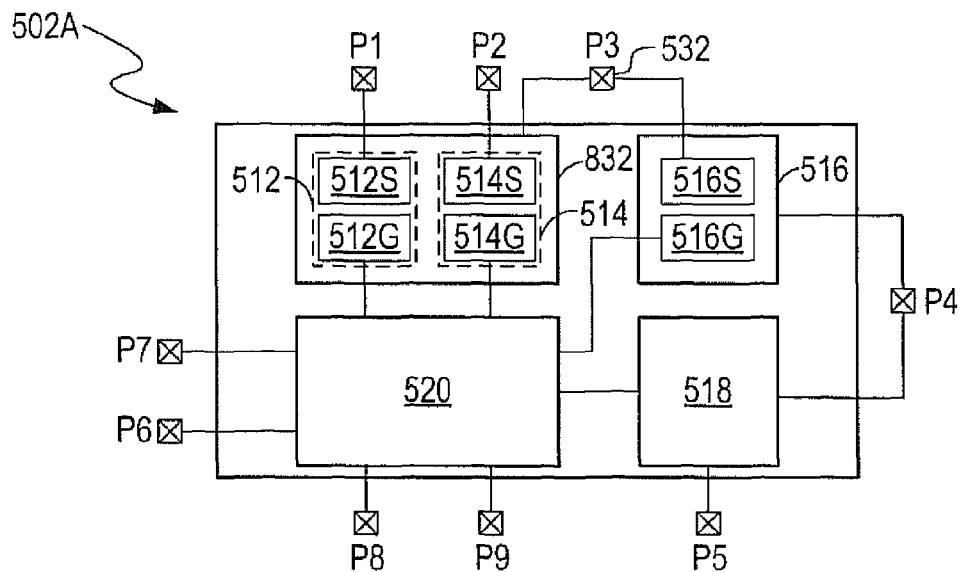
FIGS. 8A, 8B, 8C, and 8D illustrate connection diagrams of examples of power control circuitry, in accordance with embodiments of the present invention.

In the example of FIG. 8A, the first switch 512 and the second switch 514 are NMOSFETs, and the third switch 516 is a PMOSFET. The first switch 512 and the second switch 514 can be fabricated on a common semiconductor substrate 832, e.g., including the transfer terminals 512A and 514A, e.g., the drains, of the switches 512 and 514. The semiconductor substrate 832 is connected to the common pin 532, e.g., the common node 530, via a bonding wire. The source 516S of the third switch 516 is also connected to the common pin 532, e.g., the common node 530, via a bonding wire. In addition, the source 512S of the first switch 512 is connected to the pin P1, the source 514S of the first switch 512 is connected to the pin P2, and the drain, e.g., a p-type semiconductor substrate, of the third switch 516 is connected to the pin P4.

Figure 8B:
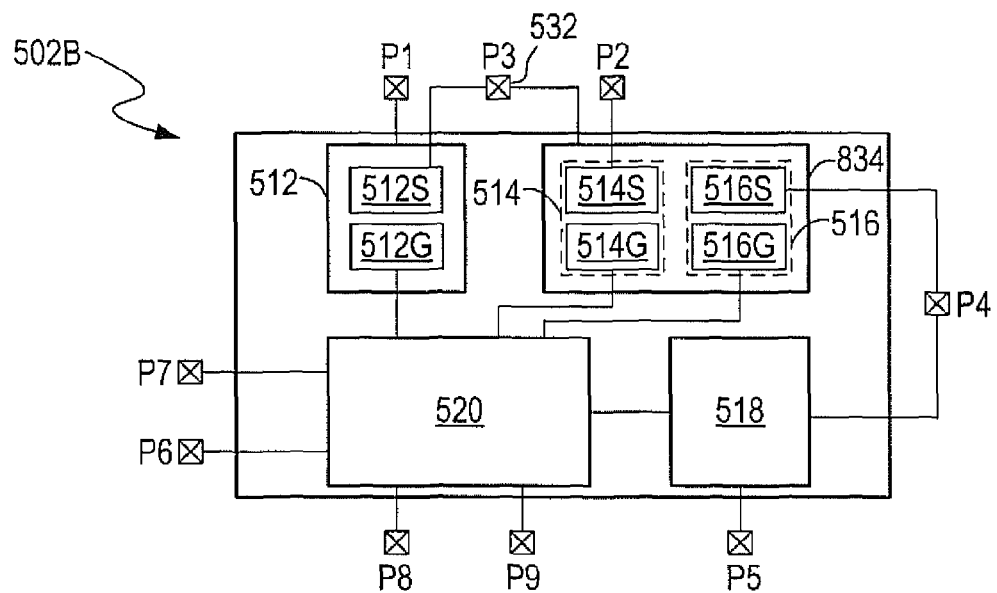

In the example of FIG. 8B, the second switch 514 and the third switch 516 are NMOSFETs, and the first switch 512 is a PMOSFET. The second switch 514 and the third switch 516 can be fabricated on a common semiconductor substrate 834, e.g., including the transfer terminals 514A and 516A, e.g., the drains, of the switches 514 and 516. The semiconductor substrate 834 is connected to the common pin 532, e.g., the common node 530, via a bonding wire. The source 512S of the first switch 512 is also connected to the common pin 532, e.g., the common node 530, via a bonding wire. In addition, the drain, e.g., a p-type semiconductor substrate, of the first switch 512 is connected to the pin P1, the source 514S of the second switch 514 is connected to the pin P2, and the source 516S of the third switch 516 is connected to the pin P4.

Figure 8C:
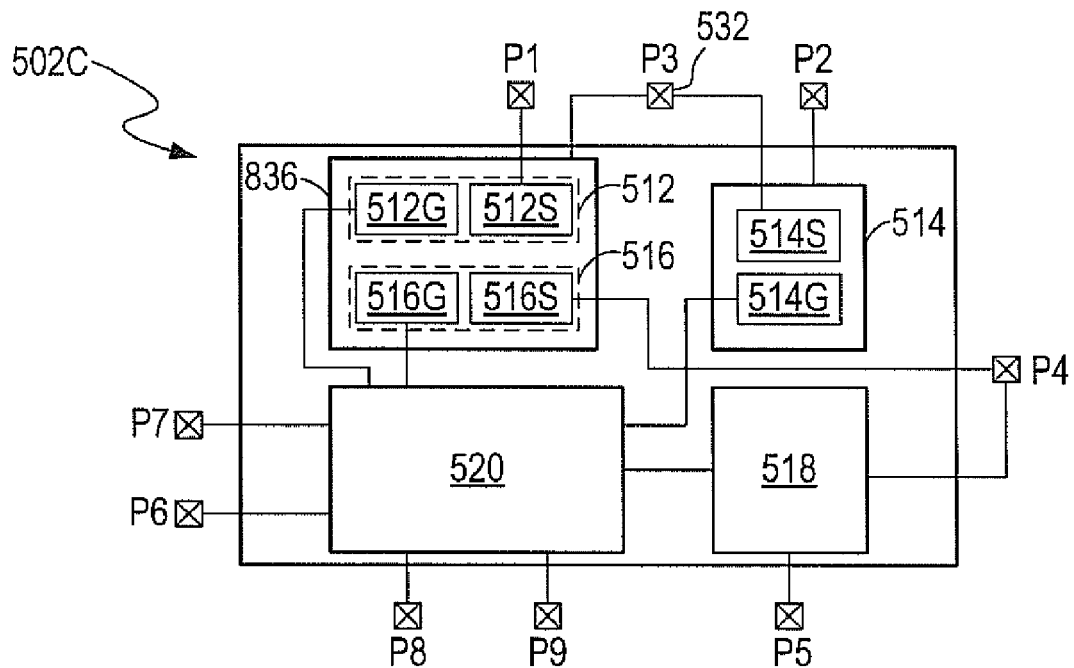

In the example of FIG. 8C, the first switch 512 and the third switch 516 are NMOSFETs, and the second switch 514 is a PMOSFET. The first switch 512 and the third switch 516 can be fabricated on a common semiconductor substrate 836, e.g., including the transfer terminals 512A and 516A, e.g., the drains, of the switches 512 and 516. The semiconductor substrate 836 is connected to the common pin 532, e.g., the common node 530, via a bonding wire. The source 514S of the second switch 514 is also connected to the common pin 532, e.g., the common node 530, via a bonding wire. In addition, the source 512S of the first switch 512 is connected to the pin P1, the source 516S of the third switch 516 is connected to the pin P4, and the drain, e.g., a p-type semiconductor substrate, of the second switch 514 is connected to the pin P2.

Figure 8D:
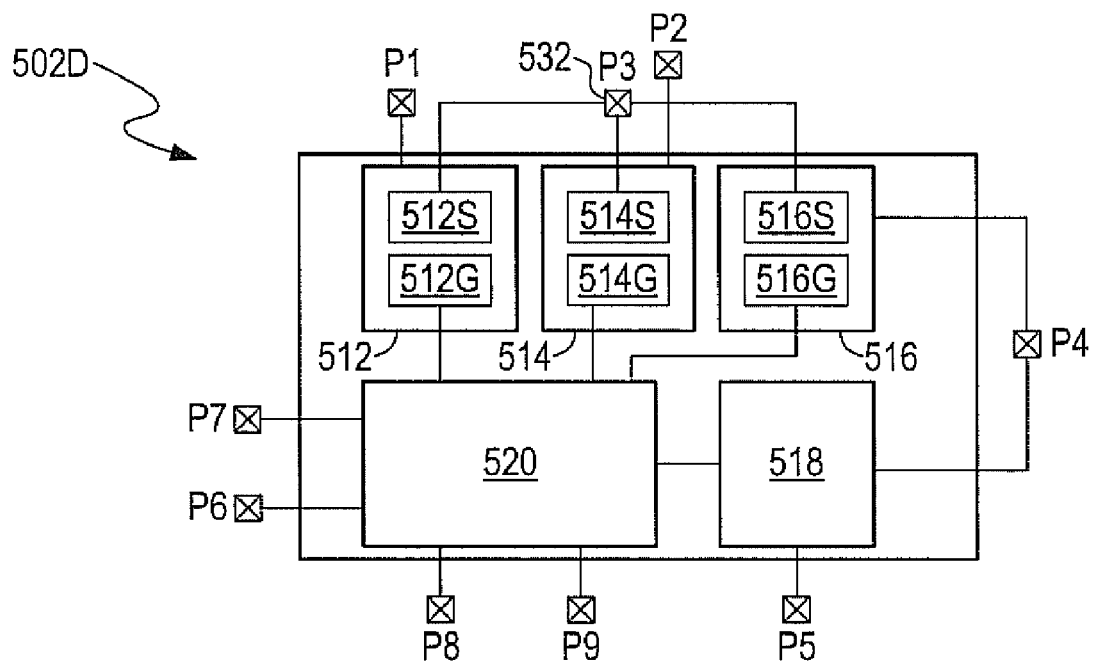

In the example of FIG. 8D, the first switch 512, the second switch 514, and the third switch 516 are PMOSFETs. Each member of the sources 512S, 514S and 516S is connected to the common pin 532, e.g., the common node 530, via a bonding wire. The drains, e.g., p-type semiconductor substrates, of the switches 512, 514 and third switch 516 are connected to the pins P1, P2 and P4, respectively.

Figure 9:
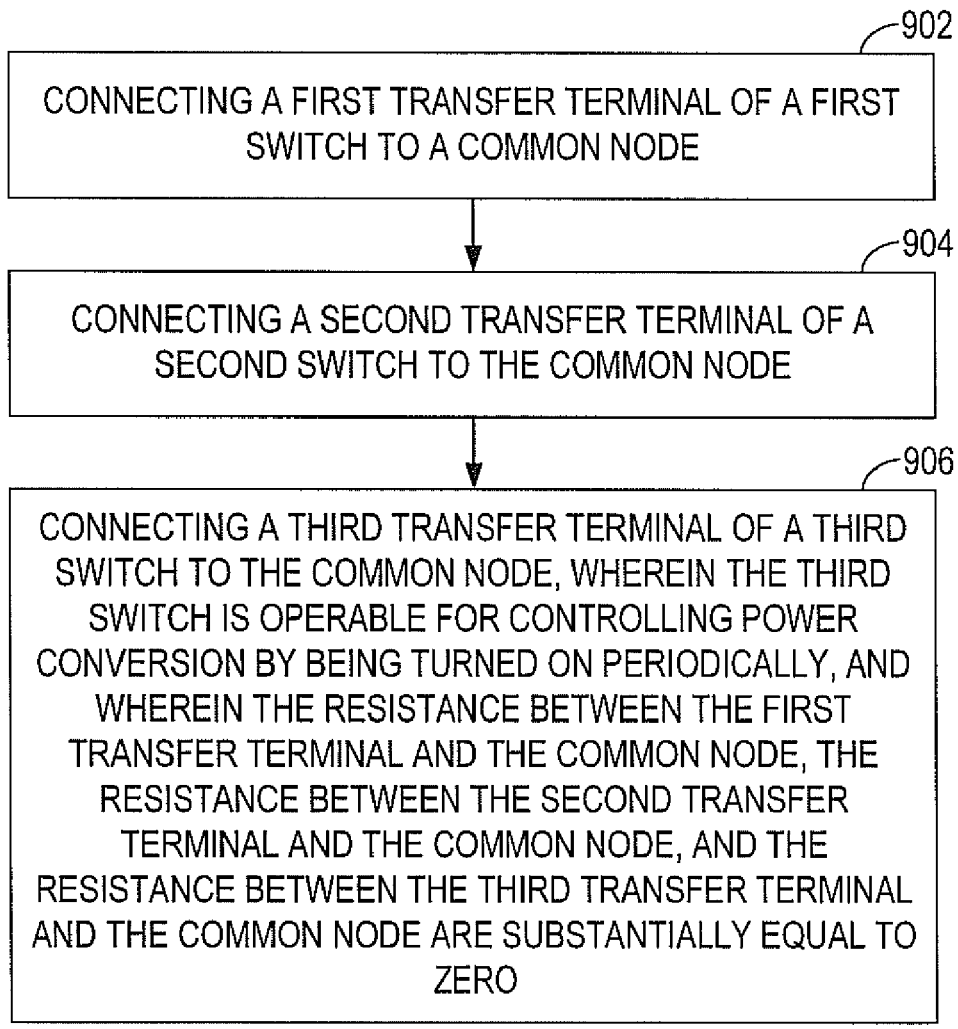
FIG. 9 illustrates examples of steps for manufacturing a power management system, in accordance with one embodiment of the present invention.

FIG. 9 illustrates examples of manufacturing steps for a power management system, in accordance with one embodiment of the present invention. FIG. 9 is described in combination with FIG. 5, FIGS. 6A and 6B, FIG. 7, and FIGS. 8A, 8B, 8C and 8D.

In block 902, the first transfer terminal 512A of the first switch 512 is connected to the common node 530. In block 904, the second transfer terminal 514A of the second switch 514 is connected to the common node 530. In block 906, the third transfer terminal 516A of the third switch 516 is connected to the common node 530.

The third switch 516 is operable for controlling power conversion by being turned on, e.g., by the controller 520, periodically. The resistance $R_{TC1}$ between the first transfer terminal 512A and the common node 530, the resistance $R_{TC2}$ between the second transfer terminal 514A and the common node 530, and the resistance $R_{TC3}$ between the third transfer terminal 516A and the common node 530 are substantially equal to zero.

Figure 10:
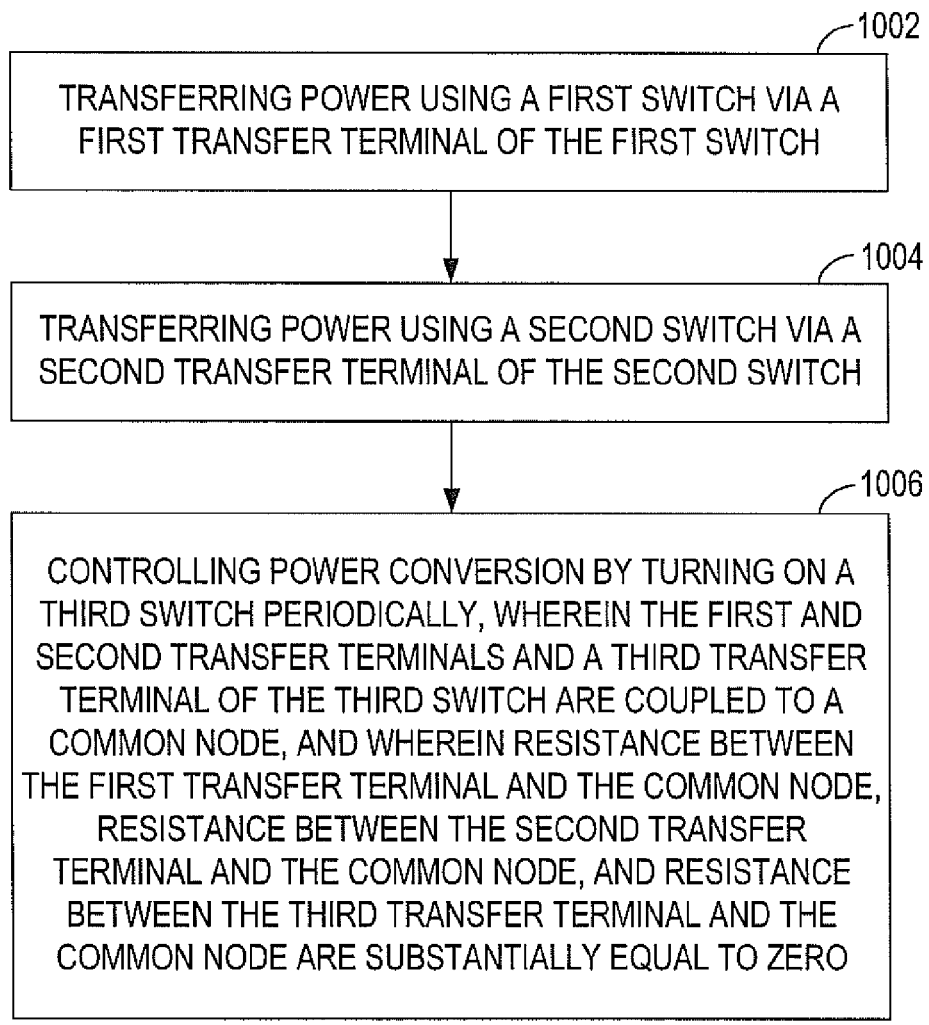
FIG. 10 illustrates examples of operations performed by a power management system, in accordance with one embodiment of the present invention.

FIG. 10 illustrates examples of operations performed by the power management system 500, in accordance with one embodiment of the present invention. FIG. 10 is described in combination with FIG. 5, FIGS. 6A and 6B, FIG. 7, and FIGS. 8A, 8B, 8C and 8D.

In block 1002, the first switch 512 transfers power via the first terminal 512A of the first switch 512.

In block 1004, the second switch 514 transfers power via the second terminal 514A of the second switch 514.

In block 1006, the controller 520 controls power conversion by turning on the third switch 516 periodically. More specifically, the controller 520 controls the power conversion by turning on the third switch 516 and the fourth switch 518 alternately and periodically. The first transfer terminal 512A, the second transfer terminal 514A, and the third transfer terminal 516A are coupled to the common node 116 directly. In other words, the resistances between the first transfer terminal 512A, the second transfer terminal 514A, the third transfer terminal 516A, and the common node 530 are substantially equal to zero.

In summary, embodiments according to the present invention provide power management systems. The power management system includes a first switch and a second switch for selecting power from different power sources. The power management system also includes a third switch and a fourth switch for converting power. The first, second and third switches share a common node/pin, therefore the PCB size, cost, and power consumption are reduced. Because of the existence of the body diodes in the switches, the switches can be integrated in a package in different ways depending on the types of the switches. If the first, second, and third switches are NMOSFETs, they can be fabricated on a common semiconductor substrate, e.g., a common node. If one of the first, second, and third switches is a PMOSFET, that switch can be separate from the other two switches, and a semiconductor well, e.g., a p-well, of the switch can be connected to the common node via a boding wire. The power management system can be used in many applications such as portable media players, cell phones, portable computers, electrical vehicles, etc.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A power management system comprising:
   a first switch having a first transfer terminal and a first body diode;
   a second switch having a second transfer terminal and a second body diode;
   a third switch having a third transfer terminal and a third body diode;
   a fourth switch coupled to said third switch and having a diode; and
   a controller coupled to said first, second, third and fourth switches and operable for controlling power conversion by turning on said third and fourth switches alternately,
   wherein said first, second and third transfer terminals are coupled to a common node, and resistance between said first transfer terminal and said common node, resistance between said second transfer terminal and said common node, and resistance between said third transfer terminal and said common node are substantially equal to zero, and wherein cathodes of said first, second and third body diodes are coupled to said common node, and a cathode of said diode is coupled to an anode of said third body diode.

2. The power management system as claimed in claim 1, wherein a switch of said first, second and third switches comprises an n-channel metal-oxide-semiconductor field-effect transistor (NMOSFET), and wherein a semiconductor substrate of said switch is connected to said common node.

3. The power management system as claimed in claim 1, wherein a switch of said first, second and third switches comprises a p-channel metal-oxide-semiconductor field-effect transistor (PMOSFET), and wherein a semiconductor well of said switch is connected to said common node.

4. The power management system as claimed in claim 1, wherein each switch of said first, second and third switches comprises an NMOSFET, wherein said first, second and third switches are fabricated on a common semiconductor substrate, and wherein said common semiconductor substrate comprises said first, second and third transfer terminals.

5. The power management system as claimed in claim 1, wherein said first switch comprises a PMOSFET, and wherein said first transfer terminal is connected to said common node via a bonding wire.

6. The power management system as claimed in claim 1, wherein said controller is operable for generating a pulse-width modulation (PWM) signal to alternately turn on said third and fourth switches, and is operable for adjusting output power of said power management system by adjusting a duty cycle of said PWM signal.

7. The power management system as claimed in claim 1, wherein said controller is operable for controlling said first, second, third and fourth switches, such that said first switch transfers power from an adapter to a load via said common node.

8. The power management system as claimed in claim 1, wherein said controller is operable for controlling said first, second, third and fourth switches, such that said second switch transfers power from a battery pack to a load via said common node.

9. The power management system as claimed in claim 1, wherein said controller is operable for controlling said first, second, third and fourth switches, such that said first and second switches transfer power from an adapter to charge a battery pack via said common node.

10. The power management system as claimed in claim 1, further comprising:
conversion circuitry operable for performing said power conversion.

11. The power management system as claimed in claim 10, wherein said controller is operable for controlling said first, second, third and fourth switches, such that said conversion circuitry receives input power via said common node and converts said input power to output power to charge a battery pack.

12. The power management system as claimed in claim 10, wherein said controller is operable for controlling said first, second, third and fourth switches, such that said conversion circuitry receives input power from a battery pack, converts said input power to output power, and transfers said output power to a load via said common node.

13. A method comprising:
transferring power using a first switch via a first transfer terminal of said first switch, said first switch having a first body diode;
transferring power using a second switch via a second transfer terminal of said second switch, said second switch having a second body diode;
converting an input power to an output power using a third switch and a fourth switch via a common node, said third switch having a third transfer terminal and a third body diode, said fourth switch coupled to said third switch and having a diode; and
controlling power conversion in said converting step by turning on said third and fourth switches alternately,
wherein said first, second and third transfer terminals are coupled to said common node, and resistance between said first transfer terminal and said common node, resistance between said second transfer terminal and said common node, and resistance between said third transfer terminal and said common node are substantially equal to zero, and wherein cathodes of said first, second and third body diodes are coupled to said common node, and a cathode of said diode is coupled to an anode of said third body diode.

14. The method as claimed in claim 13, wherein each switch of said first, second and third switches comprises an NMOSFET, wherein said first, second and third switches are fabricated on a common semiconductor substrate, and wherein said common semiconductor substrate comprises said first, second and third transfer terminals.

15. The method as claimed in claim 13, wherein said first switch comprises a PMOSFET, and wherein said first transfer terminal is connected to said common node via a bonding wire.

16. The method as claimed in claim 13, wherein said controlling comprises:
generating a PWM signal to alternately turn on said third and fourth switches; and
controlling said power conversion by adjusting a duty cycle of said PWM signal.

17. A power management system comprising:
an integrated circuit comprising a first switch, a second switch, a third switch, a fourth switch and a controller operable for controlling power conversion by turning on said third and fourth switches alternately, said first switch having a first transfer terminal and a first body diode, said second switch having a second transfer terminal and a second body diode, said third switch having a third transfer terminal and a third body diode, and said fourth switch coupled to said third switch and having a diode; and
a pin coupled to said first, second and third transfer terminals,
wherein resistance between said first transfer terminal and said pin, resistance between said second transfer terminal and said pin, and resistance between said third transfer terminal and said pin are substantially equal to zero, and wherein cathodes of said first, second and third body diodes are coupled to said common node, and a cathode of said diode is coupled to an anode of said third body diode.

18. The power management system as claimed in claim 17, wherein each switch of said first, second and third switches comprises an NMOSFET, wherein said first, second and third switches are fabricated on a common semiconductor substrate, and wherein said common semiconductor substrate comprises said first, second, and third transfer terminals.

19. The power management system as claimed in claim 17, wherein said first switch comprises a PMOSFET, and wherein said first transfer terminal is connected to said pin via a bonding wire.

20. The power management system as claimed in claim 17, wherein a switch of said first, second and third switches comprises an NMOSFET, and wherein a semiconductor substrate of said switch is connected to said pin.

21. The power management system as claimed in claim 17, wherein a switch of said first, second and third switches comprises a PMOSFET, and wherein a semiconductor well of said switch is connected to said pin.

22. The power management system as claimed in claim 17, wherein said controller is further operable for generating a PWM signal to alternately turn on said third switch and said fourth switch, and is operable for adjusting output power of said integrated circuit by adjusting a duty cycle of said PWM signal.

\* \* \* \* \*